Inventor
John Baude
By Warren F.B. Lindsley
Attorney

Sept. 25, 1962 J. BAUDE 3,056,043

GATE HAVING VOLTAGE DIVIDER SHUNTING SERIES EMITTER-COLLECTOR PATHS AND INDIVIDUAL BASE-BIAS LEVEL SETTING MEANS EQUALIZING TRANSISTOR LEAKAGE CURRENTS

Filed Aug. 5, 1958 2 Sheets-Sheet 2

Inventor
John Baude
By Warren F.B. Lindsley
Attorney 3,056,043

GATE HAVING VOLTAGE DIVIDER SHUNTING SERIES EMITTER-COLLECTOR PATHS AND INDIVIDUAL BASE-BIAS LEVEL SETTING MEANS EQUALIZING TRANSISTOR LEAKAGE CURRENTS

John Baude, Milwaukee, Wis., assignor to Allis-Chalmers Manufacturing Company, Milwaukee, Wis.

Filed Aug. 5, 1958, Ser. No. 753,272
2 Claims. (Cl. 307—88.5)

This invention relates to electric switches and more particularly to electric switches wherein a semiconductor element is used as a controlling device.

The development of commercially useful semiconductor devices such as transistors for switching purposes has many advantages over the prior art manual or magnetically triggered devices for opening or closing a circuit in response to variations in circuit conditions. Transistors are small in size, durable and consist of material having a long useful life. They respond rapidly to a triggering force and open and close the circuit without the use of moving contacts.

The use of power transistors for direct current control systems exceeding 80 to 100 volts is seriously handicapped by the fact that present day power transistors with a voltage rating exceeding 80 to 100 volts are very expensive. These voltage ratings are maximum ratings which cannot be exceeded for even very short time intervals without damage to the semiconductor material of the transistors. The current carrying capacity of the present day transistors are limited by the current carrying ability of their leads and the heat losses within their semiconductor materials. The current carrying characteristics of the transistors, however, render them useful for switching purposes wherein short time overloading may occur but definitely preclude their use if the transistors are subjected to voltage surges at a value above their voltage ratings. Any control system or electric switch utilizing a plurality of transistors in a circuit exceeding the maximum voltage rating of each individual transistor must provide close control of the voltages applied to the transistor terminals.

In accordance with the invention claimed a new and improved electric switch is provided comprising first and second transistors each having a base, an emitter and a collector. Means are provided for connecting the emitter and collector of the transistors in a series circuit across a source of electric potential. Impedance means are connected across each of the transistors from their emitter to their collector electrodes for controlling the voltages applied to the transistors. Means are connected to the base of each of the transistors for controlling conduction through the emitter collector circuit.

It is, therefore, one object of this invention to provide a new and improved transistor switch.

Another object of this invention is to provide a new and improved transistor switch for use in either an alternating or direct current circuit.

A further object of this invention is to provide a new and improved static control switch utilizing transistors having voltage ratings below the voltage rating of the controlled electric circuit.

A still further object of this invention is to provide a new and improved static control system employing transistors which divides the voltage drop proportionally across each of the transistors when their bases are positive with respect to their emitters.

Objects and advantages other than those set forth will be apparent from the following description when read in connection with the accompanying drawings, in which.

Figure 1:
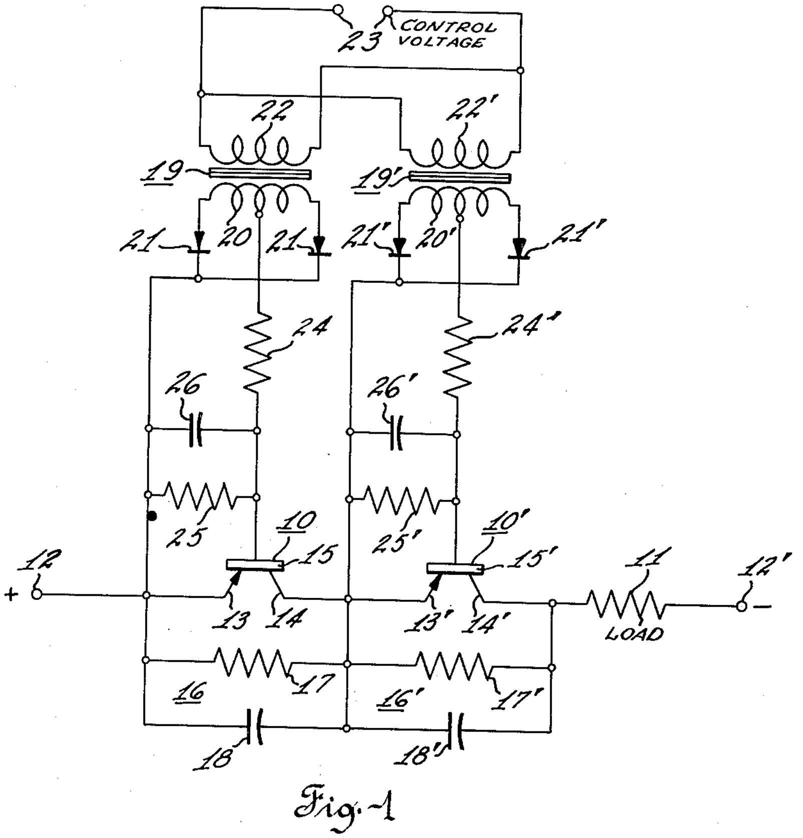
FIG. 1 is a schematic view of a transistor switch embodying the invention.

Referring more particularly to the drawings wherein like parts are designated by like characters of reference throughout the figures, FIG. 1 illustrates a pair of junction transistors 10 and 10′ connected in series with a load 11 across a source of direct current potential 12, 12′. Each transistor comprises a body of semiconducting material which may be composed of silicon, germanium or any other suitable material containing minute quantities of atomic impurities. In addition to the body, the transistors comprise emitters 13 and 13′, collectors 14 and 14′ and bases 15 and 15′. The circuit shown in FIG. 1 covers the use of PNP type transistors but can be modified for NPN type transistors if the transistors are properly connected for reverse polarities. As noted from FIG. 1 the collector 14 of transistor 10 is connected to the emitter 13′ of transistor 10′ and the collector 14′ of transistor 10′ is connected to the load 11. Impedance means 16, 16′ are connected one across each of the transistors 10, 10′ from the emitter to the collector of each of these transistors. These impedance means comprise resistors 17, 17′ connected in parallel with capacitors 18, 18′, respectively. Resistors 17, 17′ function to keep the voltage drop across each transistor from emitter to collector equal when the base of each transistor is positive with respect to the emitter. The resistance of resistors 17, 17′ is selected such that the total leakage current through the circuit from terminal 12 to terminal 12′ at cutoff is only slightly increased over and above the transistor leakage current. The capacitors 18, 18′ are used to prevent running away of one transistor with reference to the other one under switching conditions. That is, they act as buffers to slow the response of the transistors during switching from conducting to nonconducting condition or vice versa.

The emitters 13 and 13′ of transistors 10, 10′, respectively are connected to bases 15, 15′ through a suitable potential source shown here as transformers 19, 19′. The outputs of the secondary windings 20, 20′ of transformers 19, 19′ are rectified by a pair of diodes 21, 21′. The primary windings 22, 22′ of transformers 19, 19′ are connected across a suitable source of alternating current 23. The center tap of each of the secondary windings 20, 20′ are connected through resistors 24, 24′ to bases 15, 15′ of transistors 10, 10′. A pair of resistors 25, 25′ are connected one between the emitter and base of each transistor to help keep the transistors at cutoff until a control current is applied to the transistor's base. Capacitors 26, 26′ connected in parallel with resistors 25, 25′, respectively, are used to eliminate excessive surges that may enter through transformers 19, 19′. When transformers 19, 19′ are energized from the alternating current source 23 the secondary output of windings 20, 20′ are rectified by diodes 21 and 21′, and current flows from these diodes to the emitters 13, 13′ of each transistor through the transistors and resistors 24, 24′ and back to the center tap of the secondary windings 20, 20′ of transformers 19, 19′.

In accordance with the invention claimed an impedance means is connected across the emitter and collector of each transistor. The resistors act as voltage dividers and under cutoff conditions will divide the voltage across each transistor properly. Under conducting condition of the transistors the transistors will have substantially the same voltage thereacross and will pass the same amount of current if they are closely matched.

Under switching conditions from on to off there is the possibility that one transistor may conduct current quicker than the other one. This occurs if the base controls or transistors are not perfectly matched. Therefore, to eliminate or substantially reduce the differences in conducting time or current amplitude of the serially connected transistors the capacitors 18, 18' and 26, 26' are utilized to delay their response. Capacitors 18, 18' react to sudden changes in voltage like a short circuit. Since all of the circuit elements are essentially identical in size and performance, capacitors 18, 18' will discharge substantially simultaneously into their respective transistors. In view of the fact that transistors have a tremendous overcurrent rating no harm is done to the transistors by a discharge of these capacitors. When the transistors are triggered from conducting to nonconducting condition as is the situation when control power from source 23 is removed, the serially connected transistors are stabilized by capacitors 26, 26' which discharge their energy substantially simultaneously into resistors 25, 25', respectively. Capacitors 18, 18' also react as stabilizers during the transition period of the transistors from conducting to nonconducting or cutoff condition.

Although it is possible to control the power transistors by application of direct current potential individually to each base, from a commercial viewpoint it may be more desirable to supply the base potential from an alternating current source through a transformer the secondary winding of which is rectified and then supplied to the bases of each of the transistors, as shown in FIG. 1.

When the transistors 10, 10' in the triggering circuit existing between terminals 12 and 12' of the direct current source are off, the bases 15, 15' thereof are close to zero potential with respect to the emitters 13, 13'. Upon a signal impulse being applied to the transformers 19, 19' the bases of transistors 10, 10' are rendered negative and the transistors conducting. Because of the disclosed invention transistors may be used as switches to control potential source having a voltage rating exceeding the voltage rating of any one of the transistors used.

Figure 2:
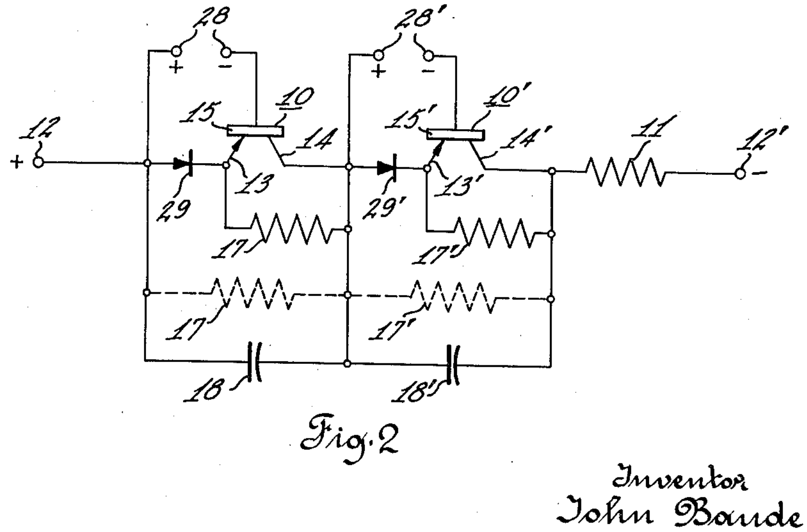
FIG. 2 is a modification of the transistor switch shown in FIG. 1 wherein the dotted showing of the resistors are a further modification of the invention.

FIG. 2 illustrates a modification of the circuit shown in FIG. 1 wherein each of the transistors 10, 10' are triggered directly by a pair of direct current sources 28, 28' connected between the emitter and base electrodes. Further, the series connected emitter collector circuit comprises a pair of diodes 29, 29' one connected in series with each of the emitters between the emitters and their terminal connections with direct current sources 28, 28'. As shown in full lines, resistors 17, 17' are each connected as in FIG. 1 from the emitter to the collector electrodes.

In order to render the bases of transistors 10, 10' more positive with reference to their emitters and thereby control the leakage current flowing from the collectors through the bases to the emitters and to prevent thermal runaway if the temperature of the transistors should rise, diodes 29, 29' are utilized in series with the emitters as shown in FIG. 2. If desired, resistors 17, 17' may be arranged across the diode, emitter and collector circuit as shown in dotted lines in FIG. 2. In the full line connection of the resistors 17, 17' the diodes 29, 29' are each in series with the flow of current through the resistors 17, 17' causing a voltage drop across the diodes and thereby rendering the bases of the transistors more positive than the emitters. This current is independent of the leakage current through the transistor and imposes a bias upon the transistor which is not responsive to temperature. In the dotted illustration of the resistors 17, 17' the leakage current is reduced and retarded so that the voltage drop does not appear across the diodes until current flows through the diodes. Therefore, the diodes 29, 29' are not as effective in rendering the bases more positive than when the resistors 17, 17' are connected as shown in the dotted positions in FIG. 2.

Figure 3:
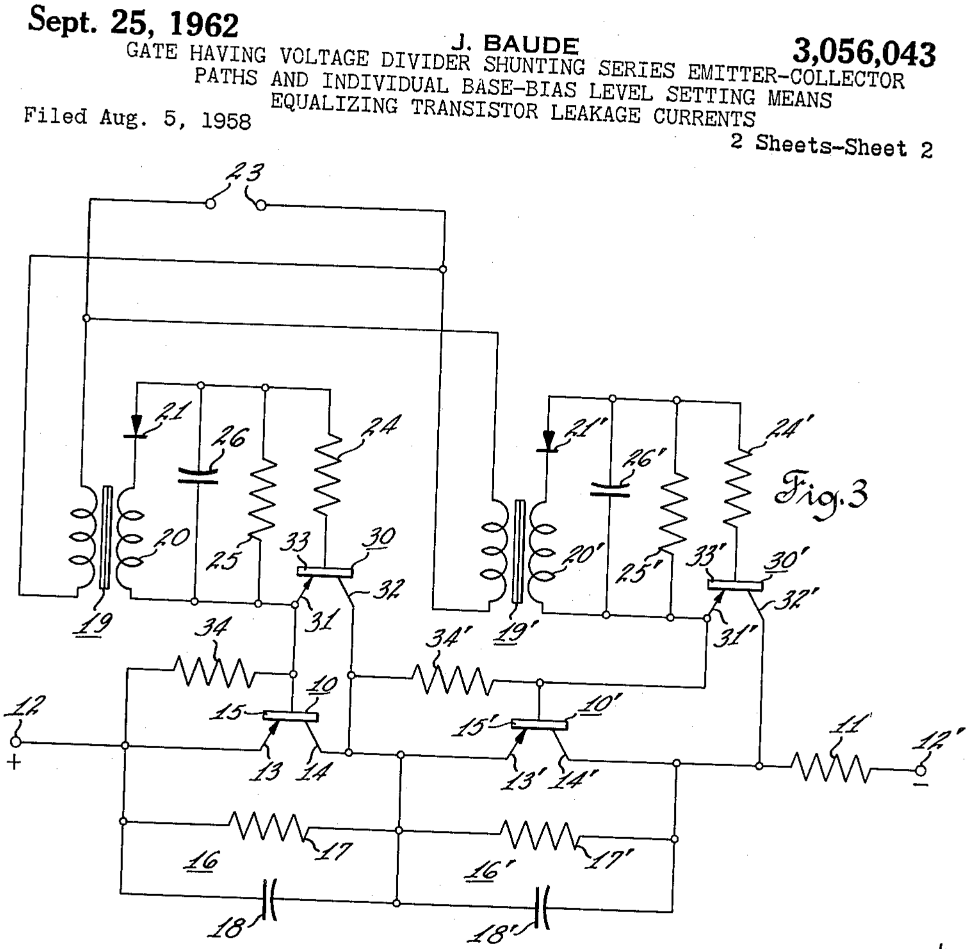
FIG. 3 is a further modification of the transistor switch shown in FIG. 1 illustrating a compound connection of the transistors embodying the invention.

FIG. 3 is a modification of the transistor switch structure shown in FIGS. 1 and 2 and comprises a compound connection of a plurality of transistors embodying the invention. Two transistors may be connected in the compound connection to obtain a single three terminal unit. This form of connection may be used for obtaining a transistor arrangement having an emitter to collector current amplification factor of approximately 1. As the current is increased to the first of two compound connected transistors more current is diverted to the second transistor, the output current of this compound arrangement being the sum of the collector currents of the two transistors. The load sharing properties of this arrangement is utilized in combination with the invention as shown in FIG. 3.

In FIG. 3 transistors 30, 30' have their emitters 31, 31' connected to the bases 15, 15' of transistors 10, 10' and transformers 19, 19', respectively. The collectors 32, 32' of transistors 30, 30' are connected to the collectors 14, 14' of transistors 10, 10' in the usual manner for this type of compound arrangement. Bases 33, 33' are connected through resistors 24, 24' and diodes 21, 21', respectively, to one side of the secondary windings 20, 20' of transformers 19, 19'. The other side of the secondary windings 20, 20' are connected to the emitters 31, 31' of transistors 30, 30', respectively. Resistors 34, 34' are provided for connecting the bases of transistors 10, 10' to their respective emitters 13, 13' to provide a cutoff bias as previously explained with reference to FIG. 1. The circuit shown in FIG. 3 requires much less control power to carry the same load current of the transistors shown in FIGS. 1 and 2 and, therefore, proves to be more stable than the circuits shown in FIGS. 1 and 2. With the circuits shown in FIGS. 1 and 2 a change in the load circuit which would change the base drive requirements could result in failure of the transistor due to the increased voltage drop across the emitter and collector and the resulting greater heat dissipation within the transistor. If for some reason the transistors 10, 10' are overloaded part of the load current will be diverted to transistors 30, 30'. Thus, in this compound arrangement a high degree of amplification of the control current occurs and the circuit will remain stable because the load current will be divided between the transistors 10, 10' depending on the voltage drop across the emitter and collector of transistors 10, 10'.

Figure 4:
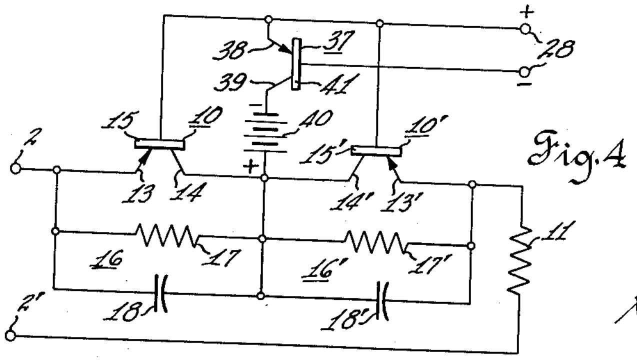
FIG. 4 is a still further modification of the transistor switch shown in FIG. 1 embodying the invention wherein the transistors are connected in series across an alternating current source.

FIG. 4 illustrates a further modification of the invention shown in FIGS. 1–3 wherein an alternating current tandem operation of two transistors is used for switching purposes. As shown in FIG. 4 the collectors 14, 14' of transistors 10, 10' are connected together with their emitters 13, 13' in series with load 11 across the alternating current source 2, 2'. Impedance means 16, 16' comprising resistors 17, 17' connected in parallel with capacitors 18, 18' are connected one between the emitter and collector electrodes of each transistor 10, 10'. Bases 15, 15' are connected to the positive side of the direct current source 28. A transistor 37 is connected with its emitter 38 to the base 15 of transistor 10 and its collector 39 to the negative terminal of a direct current source 40. The positive terminal of source 40 is connected to the interconnected collectors 14, 14' of transistors 10, 10'. Base 41 of transistor 37 is connected to the negative terminal of source 28. By using the source 40 in series with the collector emitter circuit of transistor 37 in the base control circuit of transistors 10, 10', amplification of the signal from source 28 is obtained.

Figure 5:
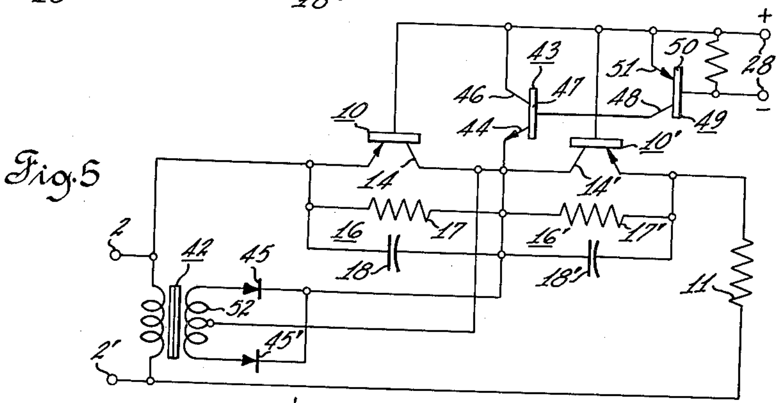
FIG. 5 is a modification of the transistor switch shown in FIG. 4 wherein a transformer is used for providing control bias for the base electrode circuit.

FIG. 5 illustrates a modification of the transistor control circuit shown in FIG. 4 wherein a transformer 42 arranged across the alternating current source 2, 2' is provided for supplying the direct current potential to a NPN transistor 43. Transistor 43 has its emitter 44 connected in series with one end of the secondary winding 52 of transformer 42 through a diode 45. The center top of winding 52 is connected to the interconnected collectors 14, 14' of transistors 10, 10'. The other end of winding 52 is connected through a diode 45 to the series connection of diode 45 and emitter 44. The collector 46 of transistor 43 is connected to the common base connection of transistors 10, 10' and the positive terminal of the source 28. The base 47 of transistor 43 is connected to the collector 48 of PNP transistor 49. The base 50 of transistor 49 is connected to the negative terminal of the signal source 28. The emitter 51 of transistor 49 is connected to the positive terminal of source 28.

The circuit illustrated in FIG. 5 is a practical application of the basic transistor control principle disclosed for controlling an alternating current circuit. Using an NPN type transistor in the control circuit provides easy amplification of the control signal.

If desired, the emitter and collector connection of transistors 10, 10' shown in FIGS. 4 and 5 may be reversed thereby requiring less control power for controlling the switching function formed by these transistors. However, the conductivity of this circuit is not as pronounced when the control power or signal is applied between the base and emitter electrodes as compared to applying it between the base and collector electrodes of transistors 10, 10'.

Although but a few embodiments of the present invention have been illustrated and described it will be apparent to those skilled in the art that various changes and modifications may be made therein without departing from the spirit of the invention or from the scope of the appended claims.

Having now particularly described and ascertained the nature of my said invention and the manner in which it is to be performed, I declare that what I claim is:

1. In an electric switch, first and second transistors each having a base, an emitter and a collector, means for connecting said emitter and collector of each of said transistors in series circuit across a source of electrical potential, impedance means connected across each of said transistors from said emitter to said collector for equally controlling the voltage applied to said transistors, and means connected to said base of each of said transistors for equally controlling conduction through and voltage applied to said emitter collector circuit, said latter means comprising an impedance means connected between said base and said emitter of each of said transistors.

2. In an electric switch, first and second transistors each having a base, an emitter and a collector, means for connecting said emitter and collector of each of said transistors in series circuit across a source of electrical potential, impedance means connected across each of said transistors from said emitter to said collector for equally and substantially simultaneously controlling the voltage applied to said transistors, and means connected to said base of each of said transistors for equally and substantially simultaneously controlling conduction through and voltage applied to said emitter collector circuit, said latter means comprising a resistor and a capacitor connected in parallel between said base and said emitter of each of said transistors.

References Cited in the file of this patent

UNITED STATES PATENTS

| | | |
|---|---|---|
| 2,533,001 | Eberhard | Dec. 5, 1950 |
| 2,776,382 | Jensen | Jan. 1, 1957 |
| 2,798,993 | Dion | July 9, 1957 |
| 2,832,900 | Ford | Apr. 29, 1958 |
| 2,833,938 | Pinckaers | May 6, 1958 |
| 2,877,360 | Moore et al. | Mar. 10, 1959 |
| 2,926,307 | Ehret | Feb. 23, 1960 |
| 2,957,993 | Sichling | Oct. 25, 1960 |

FOREIGN PATENTS

| | | |
|---|---|---|
| 536,516 | Great Britain | May 16, 1941 |
| 787,141 | Great Britain | Dec. 4, 1957 |
| 1,020,673 | Germany | Dec. 12, 1957 |
| 1,145,723 | France | Oct. 29, 1957 |